US010643953B2

(12) United States Patent
Tuominen et al.

(10) Patent No.: US 10,643,953 B2
(45) Date of Patent: May 5, 2020

(54) ELECTRONIC COMPONENT PACKAGED IN COMPONENT CARRIER SERVING AS SHIELDING CAGE

(71) Applicant: AT & S Austria Technologie & Systemtechnik Aktiengesellschaft, Leoben (AT)

(72) Inventors: Mikael Tuominen, Shanghai (CN); Christian Vockenberger, Leoben (AT); Wolfgang Schrittwieser, Kapfenberg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 7 days.

(21) Appl. No.: 15/780,019

(22) PCT Filed: Nov. 30, 2016

(86) PCT No.: PCT/EP2016/079207
§ 371 (c)(1),
(2) Date: May 30, 2018

(87) PCT Pub. No.: WO2017/093281
PCT Pub. Date: Jun. 8, 2017

(65) Prior Publication Data
US 2018/0358302 A1 Dec. 13, 2018

(30) Foreign Application Priority Data
Nov. 30, 2015 (DE) .................. 10 2015 120 735

(51) Int. Cl.
*H01L 23/552* (2006.01)
*H01L 23/00* (2006.01)
(Continued)

(52) U.S. Cl.
CPC ........ *H01L 23/552* (2013.01); *H01L 21/4853* (2013.01); *H01L 21/56* (2013.01);
(Continued)

(58) Field of Classification Search
CPC ............... H01L 23/552; H01L 23/3114; H01L 23/5389; H01L 2924/3025; H01L 2224/32245; H01L 23/3107
See application file for complete search history.

(56) References Cited

U.S. PATENT DOCUMENTS 7,633,170 B2    12/2009   Yang et al.
8,633,091 B2 *   1/2014   Tsai .................... H01L 23/552
                                                     257/E21.599
(Continued)

FOREIGN PATENT DOCUMENTS

EP    1 589 797 A2   10/2005
JP    2000-232263 A   8/2000
WO   WO2014154000 A1   10/2014

*Primary Examiner* — Bac H Au
(74) *Attorney, Agent, or Firm* — Robert A. Blaha; Smith Tempel Blaha LLC

(57) ABSTRACT

An electronic device having an electronic component with electric terminals and a component carrier in which the electronic component is packaged. The component carrier includes a shielding cage surrounding all sides of the electronic component at least partially.

4 Claims, 5 Drawing Sheets

(51) Int. Cl.
*H01L 23/31* (2006.01)
*H01L 21/48* (2006.01)
*H01L 21/56* (2006.01)
*H01L 23/538* (2006.01)

(52) U.S. Cl.
CPC ...... *H01L 23/3107* (2013.01); *H01L 23/3114* (2013.01); *H01L 23/3121* (2013.01); *H01L 23/5389* (2013.01); *H01L 24/19* (2013.01); *H01L 24/20* (2013.01); *H01L 24/96* (2013.01); *H01L 21/561* (2013.01); *H01L 2223/6677* (2013.01); *H01L 2224/04105* (2013.01); *H01L 2224/214* (2013.01); *H01L 2224/32245* (2013.01); *H01L 2224/73267* (2013.01); *H01L 2224/92144* (2013.01); *H01L 2924/14* (2013.01); *H01L 2924/1431* (2013.01); *H01L 2924/3025* (2013.01)

(56) References Cited

U.S. PATENT DOCUMENTS

| | | | |
|---|---|---|---|
| 8,937,370 B2 * | 1/2015 | Song | H01L 23/522 |
| | | | 257/659 |
| 9,099,455 B2 * | 8/2015 | Chow | H01L 21/561 |
| 2003/0218257 A1 | 11/2003 | Ishio et al. | |
| 2004/0245640 A1 | 12/2004 | Tsukamoto et al. | |
| 2006/0214278 A1 | 9/2006 | Martin | |
| 2009/0256244 A1 * | 10/2009 | Liao | H01L 21/568 |
| | | | 257/660 |
| 2010/0109132 A1 * | 5/2010 | Ko | H01L 21/561 |
| | | | 257/660 |
| 2011/0298111 A1 | 12/2011 | Kim | |
| 2012/0020044 A1 | 1/2012 | Iihola et al. | |
| 2013/0082366 A1 | 4/2013 | Jung | |
| 2013/0105950 A1 | 5/2013 | Bergemont et al. | |
| 2015/0108621 A1 * | 4/2015 | Pabst | H01L 23/552 |
| | | | 257/659 |
| 2015/0163966 A1 | 6/2015 | Tuominen | |
| 2015/0194388 A1 * | 7/2015 | Pabst | H01L 23/552 |
| | | | 257/659 |
| 2015/0279789 A1 * | 10/2015 | Mahajan | H01L 23/552 |
| | | | 257/659 |
| 2016/0064329 A1 * | 3/2016 | Lee | H01L 23/5389 |
| | | | 257/659 |
| 2016/0172309 A1 * | 6/2016 | Gong | H01L 24/97 |
| | | | 257/659 |
| 2016/0254230 A1 * | 9/2016 | Lee | H01L 23/552 |
| | | | 257/659 |
| 2017/0110413 A1 * | 4/2017 | Chen | H01L 21/3205 |

* cited by examiner

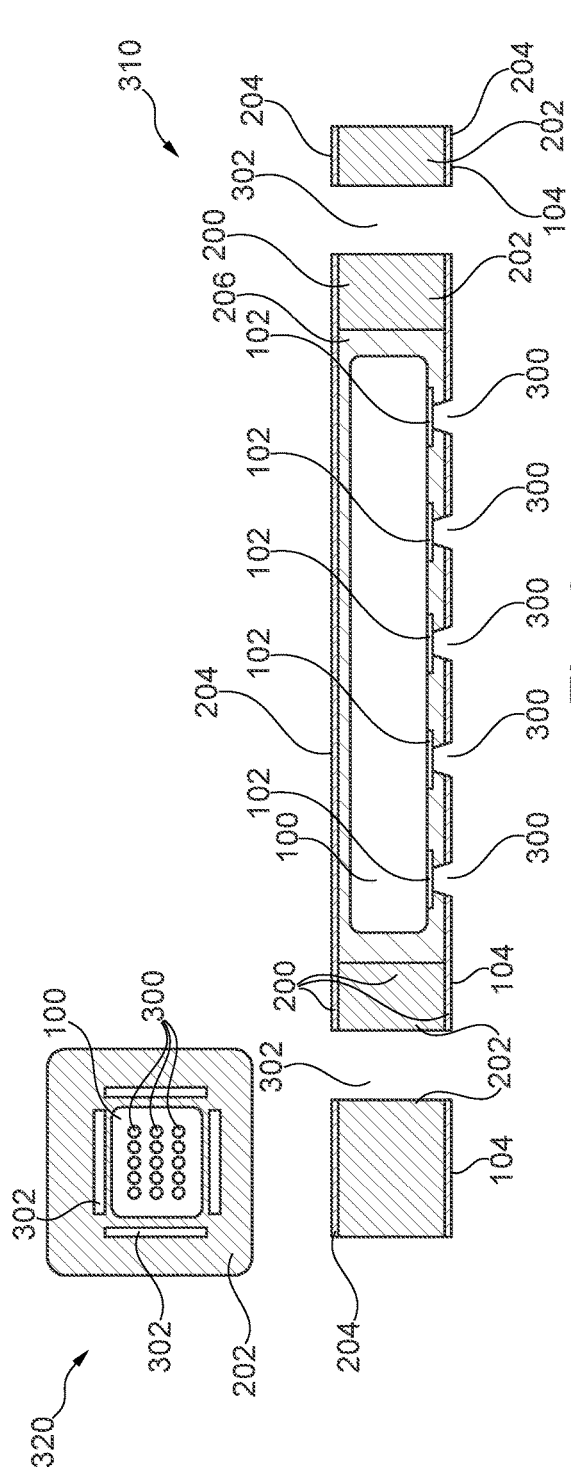
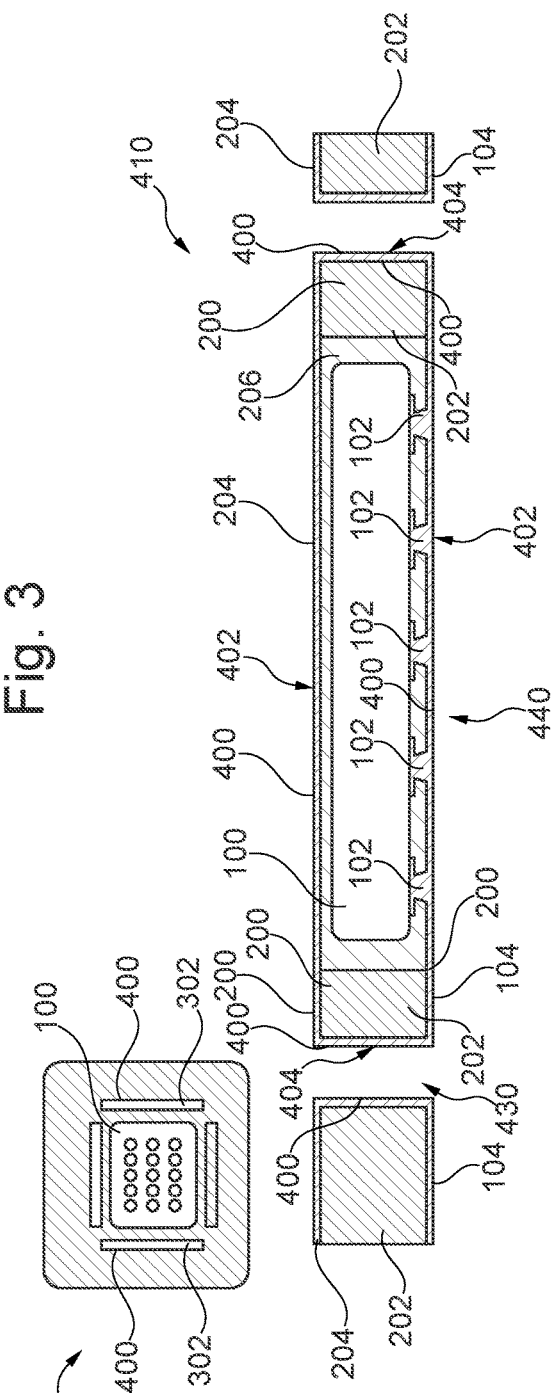

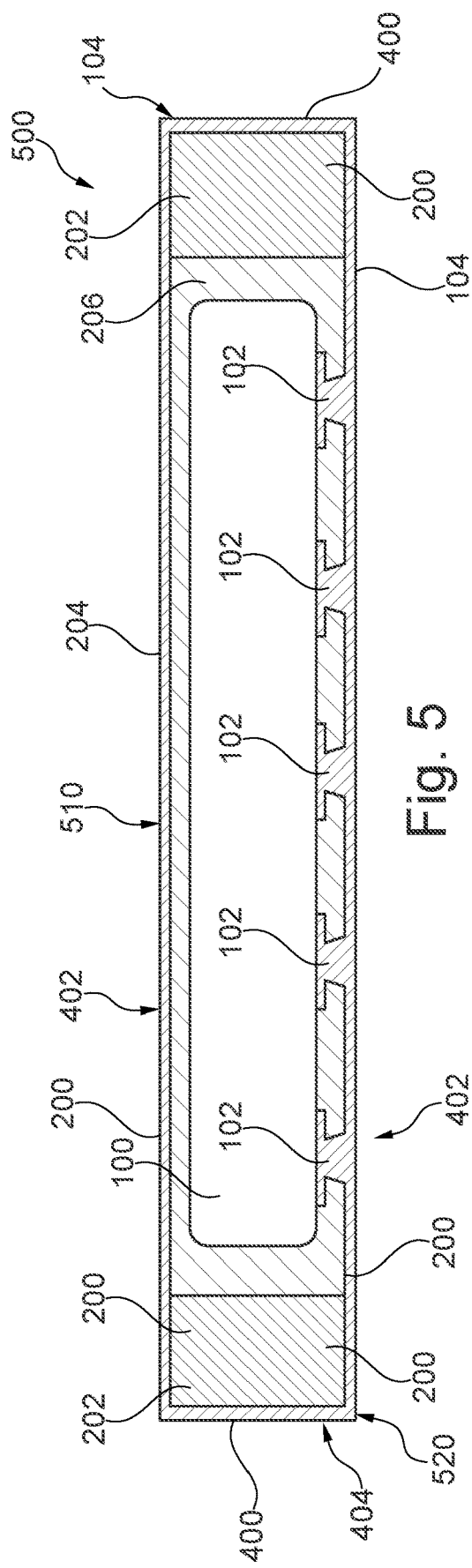
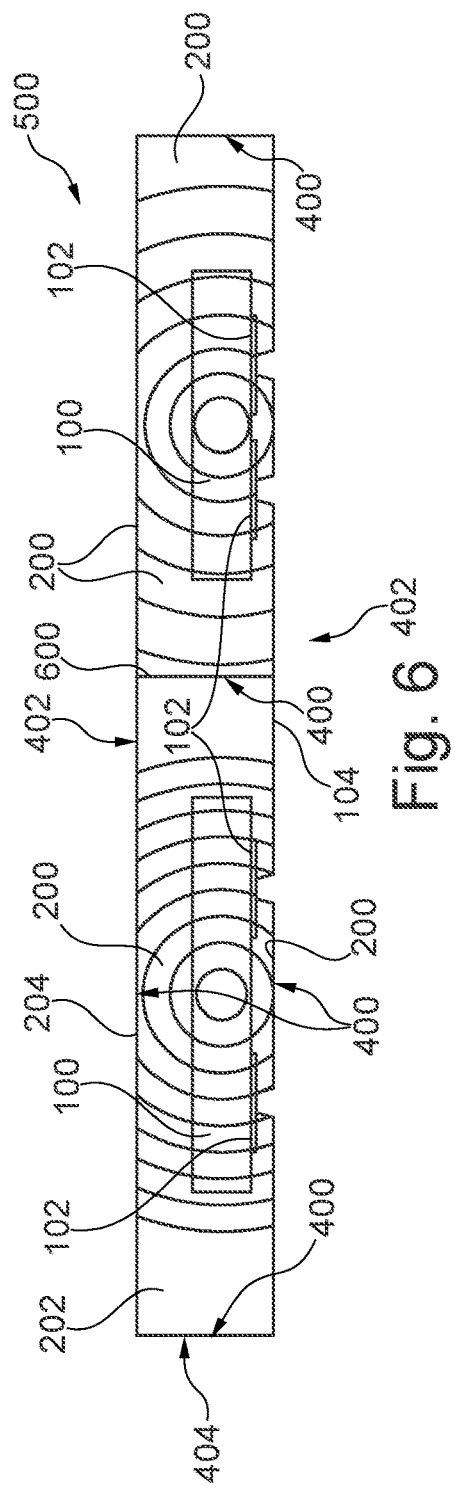
Fig. 5
Fig. 6

ELECTRONIC COMPONENT PACKAGED IN COMPONENT CARRIER SERVING AS SHIELDING CAGE

TECHNICAL FIELD

Embodiments of the invention relate to an electronic device, an electronic arrangement, and a method of manufacturing an electronic device.

TECHNOLOGICAL BACKGROUND

Conventionally, naked dies and other electronic components are pack-aged in mold compounds made of plastic or resin. With continuous demand for small form factors and improved performance at lower costs, there is still room for improved packaging solutions.

With increasing operating frequencies and the increasing complexity of electronic circuits, the latter become more and more prone to failure as a result of electromagnetic interference (EMI). In particular in the situation of several electronic components being embedded in a same circuit board, it may even happen that these electronic components electromagnetically influence each other. Such an undesired interaction between different embedded electronic components can be caused by the generation and propagation of electromagnetic radiation between such components.

SUMMARY

There may be a need to enable compact packaging of electronic components with high robustness against electromagnetic interference.

An electronic device, an electronic arrangement, and a method of manufacturing an electronic device according to the independent claims are provided.

According to an exemplary embodiment of the invention, an electronic device is provided which comprises an electronic component (such as a naked die) or a plurality of electronic components (i.e. a system of multiple electronic components, in particular interacting with one another) with electric terminals (for external electric connection of the electronic component), and a component carrier (i.e. a carrier structure in and/or on which one or more electronic components may be mounted) in which the electronic component is packaged or embedded, wherein the component carrier comprises (i.e. as part of the component carrier rather than as a separate member) a shielding cage surrounding all sides of the electronic component at least partially.

According to another exemplary embodiment of the invention, an electronic arrangement is provided which comprises an electronic device having the above-mentioned features, and a mounting base on which the electronic device is mounted (in particular surface mounted).

According to still another exemplary embodiment of the invention, a method of manufacturing an electronic device is provided, wherein the method comprises providing an electronic component (in particular a naked die) with electric terminals, packaging or embedding the electronic component within a component carrier, and equipping the component carrier with a shielding cage surrounding all sides of the electronic component at least partially.

Overview of Embodiments

In the context of the present application, the term "component carrier package" may particularly denote any package or casing which is capable of accommodating one or more electronic components therein for providing both mechanical support and electrical connectivity.

In the context of the present application, the term "component carrier" may particularly denote any support structure which is capable of accommodating one or more electronic components thereon and/or therein for providing both mechanical support and electrical connectivity.

In the context of the present application, the term "shielding cage" may particularly denote an electrically conductive structure polydirectionally enclosing at least a substantial part of the component carrier and being capable of shielding electromagnetic waves from propagating from an interior of the component carrier to an exterior thereof, or from an exterior of the component carrier to an interior thereof, thereby efficiently suppressing electromagnetic interference (EMI). In particular, such a shielding cage may form a sort of Faraday cage preventing electromagnetic radiation from penetrating into undesired areas. Hence, the material of the shielding cage should be such and its geometric arrangement should be of such kind that efficiently inhibits electromagnetic interference. For instance, a thickness of the material of the shielding cage may be in a range between 1 µm and 60 µm, in particular in a range between 12 µm and 40 µm.

In the context of the present application, the term "surrounding all sides of the electronic component at least partially" may particularly denote that the embedded electronic component is substantially fully (in particular hermetically) surrounded by the shielding cage or is at least partially surrounded by the shielding cage to such a degree that only insignificantly small portions of the cage are prone to be transmissive for electromagnetic radiation propagating between the electromagnetically caged electronic component and the cage external environment. For instance, an only partial surrounding should not leave a full sidewall of the embedded electronic component completely unprotected by material of the shielding cage because a fully unshielded face of the electronic component would already allow a non-neglectable leakage of electromagnetic radiation. The electronic component has six sides corresponding to the three orthogonal spatial directions, wherein the electronic component may be viewed for each of these spatial directions from two opposing viewing directions. The term "surrounding all sides of the electronic component at least partially" may now particularly denote that from each of the six viewing directions, the corresponding side or face or projection of the electronic component is at least partially covered with electrically conductive material of the shielding cage. A particularly efficient shielding can be obtained when the electrically conductive material of the shielding cage covers the electronic component from at least five sides completely, whereas the sixth side maybe preferably also fully or substantially fully covered (see for instance FIG. 5), or only partially covered (see for instance FIG. 14), for instance to use an electrically conductive pattern on this sixth side for transmitting electric signals between the packaged electronic component and the exterior of the electronic device. In an embodiment, the four lateral sides of the electronic component are completely surrounded or covered in a sheet-like manner (which may be easily achieved by the formation of side wall exposing oblong through holes for instance, see FIGS. 3 and 4, and which may allow singularizing the thus shielded electronic device and subsequently assembling the thus obtained (laterally completely) shielded electronic device for instance on a printed circuit board), whereas the upper side and/or the lower side of the electronic component is also fully or substantially fully covered or only partially covered. When keeping one or more sides completely uncovered, the shielding capability of the shielding cage would be significantly reduced or might even be lost. In particular, the shielding cage may comprise six electrically conductive and electromagnetic wave shielding portions each of which being assigned to a respective one of six viewing directions (being perpendicular or antiparallel to one another) on the embedded electronic component.

According to an exemplary embodiment of the invention, an efficient shielding of one or more embedded electronic components in an interior of a component carrier such as a circuit board is provided in which a spatially constricted shielding of the electronic component is obtained. This is achieved by configuring a shielding cage to form part of the component carrier itself rather than providing a separate exterior shielding casing or lid. By taking this measure, a compact electronic device with an efficient protection against electromagnetic interference is obtained, allowing for a continued miniaturization while enabling failure free operation of one or more electronic components even at very high operating frequencies. Therefore, an electronic device, such as a printed circuit board, with one or more embedded electronic components is configured in such a way that the electromechanical interferences (EMI) are efficiently suppressed, thereby increasing the reliability of the electronic device. Advantageously, this is done in a way which keeps the size of the electronic device very small and which does not require to implement other materials or processes than those from circuit board formation technology. In this way, the shielding cage can be located very close to the electronic component which may be a source of the electromagnetic distortions (in particular when the electronic component is a microprocessor). Hence, the shielding may act at a position where the disturbance source is located. This means that the respective electronic component which generates the electromagnetic interference and which emits corresponding electromagnetic radiation can also be integrated with or embedded within the component carrier. This architecture makes it also possible that a layer thickness of a respective portion of the shielding cage may be specifically adapted to the operating frequencies to obtain an application specific optimized shielding or damping. Moreover, the described architecture of shielding electromagnetic radiation does not only allow to shield electromagnetic radiation between different electronic devices and their respective electronic components, but also between two or more (for instance embedded or surface-mounted) electronic components of one and the same electronic device or related to the same component carrier.

In the following, further exemplary embodiments of the electronic device, the electronic arrangement and the method will be explained.

In an embodiment, the electronic component is a naked die, in particular an unpackaged semiconductor chip. In such an embodiment, the electronic device may be kept very small, since the naked die can be packaged within the component carrier without requiring a molding compound (or the like) surrounding it, for instance made of plastic or resin. Thus, the electronic device architecture not only provides an efficient electromagnetic shielding, but also a compact packaging technology within a component carrier.

In an embodiment, the component carrier comprises or consists of a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further electronic components and being nevertheless very thin and compact. The term "layer structure" may particularly denote a continuous layer, a patterned layer or a plurality of non-consecutive islands within a common plane.

In an embodiment, the shielding cage is configured for shielding electromagnetic radiation from propagating between an interior and an exterior of the shielding cage. Thus, the shielding cage may inhibit inter-electronic device distortions caused by electromagnetic radiation. However, additionally or alternatively, also electromagnetic interference between several electronic components embedded within the same component carrier can be suppressed by a correspondingly configured shielding cage (i.e. inhibiting intra-electronic device distortions).

In an embodiment, the shielding cage is at least partially formed by the at least one electrically conductive layer structure, in particular at least partially on at least one of main surfaces of the component carrier (for instance one or more copper foils).

In an embodiment, the component carrier is shaped as a plate. This contributes to the compact design of the electronic device, wherein the component carrier nevertheless provides a large basis for mounting electronic components thereon. Furthermore, in particular a naked die as preferred example for an embedded electronic component, can be conveniently embedded, thanks to its small thickness, into a thin plate such as a printed circuit board.

In an embodiment, the shielding cage is at least partially formed by an electrically conductive coating of at least one of the group consisting of main surfaces of the plate and lateral side walls of the plate. On the main surfaces, the coating may be formed by a metal foil, in particular a copper foil. On the lateral surfaces, the coating may be formed by plating. Thus, it may be sufficient for providing the shielding cage to simply plate upper and lower main surfaces and oblong rectangular-shaped lateral sidewalls of a plate-shaped component carrier with electrically conductive material. Hence, without insignificant increase of the dimensions and weight of the electronic device, an efficient shielding cage may be formed. Moreover, certain components such as metallic layers on at least part of the main surfaces may be simultaneously used as electrically conductive coupling structures.

In an embodiment, the shielding cage is at least partially formed in an interior of the component carrier, in particular comprises electrically conductive material in the interior of the component carrier extending along a direction which differs from at least one main surface of the component carrier. In such an embodiment, the spatial distance between the embedded electronic component to be shielded and the shielding cage is further reduced, since the shielding cage may extend into the interior of the component carrier and therefore very close to (even in physical contact with) the electronic component. For instance, the shielding cage may be at least partially formed by a substantially cup-shaped metallic coating formed after having produced a recess in an interior of a plate-shaped component carrier. After that, the electronic component to be embedded may be inserted into and accommodated by the formed recess.

In an embodiment, at least part of the shielding cage is arranged at an interface between the electronic component and the component carrier. Therefore, the electromagnetic radiation may be damped or filtered away directly at a position where the same is generated.

In an embodiment, the shielding cage fully (completely) surrounds at least all lateral sides of the electronic component. By hermetically surrounding or at least substantially hermetically surrounding all (in particular all four) lateral sides of the electronic component, which may for instance be easily achieved by the formation of side wall exposing oblong through holes (see FIGS. 3 and 4), it may be possible to singularize the thus (laterally completely) shielded electronic device and subsequently directly use the thus obtained shielded electronic device in other assemblies, for instance as a shielded component on a printed circuit board (see FIG. 15).

In an embodiment, the shielding cage covers at least all lateral sides of the electronic component in a sheet-like (or planar) manner. In such embodiment, those parts of the shielding cage located at the lateral sides of the electronic component may have a sheet-like or planar shape and may cover (or surround) the central part of the lateral sides of the electronic component, thereby covering the lateral sides to a large extent, but may leave the edges of the lateral sides of the electronic component uncovered (unshielded). Such a configuration may for instance be particularly easily achieved by the formation of side wall exposing oblong through holes (see FIGS. 3 and 4) and may provide for an already sufficient shielding of an electronic device singularized therefrom and subsequently directly used in other assemblies, for instance as a shielded component on a printed circuit board.

In an embodiment, the shielding cage fully surrounds the electronic component. By hermetically surrounding or at least substantially hermetically surrounding the entire electronic component with the shielding structure, it is possible to shield a large majority of the generated electromagnetic radiation.

In an embodiment, the electronic device comprises adhesive material between at least part of the electronic component and the component carrier. Therefore, the electronic component to be embedded may be glued in place at a desired position within the component carrier thereby ensuring correct positioning of the latter. Selectively, the applied glue may be electrically conductive for simultaneously electrically coupling the embedded component to the environment via the glue, or may be electrically insulating so as to embed the electronic component without undesired electric paths.

In an embodiment, the component carrier is configured as one of the group consisting of a printed circuit board, and a substrate.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

In the context of the present application, the term "substrate" may particularly denote a small component carrier having substantially the same size as an electronic component to be mounted thereon.

In an embodiment, the electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip. However, other electronic components, in particular those who generate and emit electromagnetic radiation and/or are sensitive with regard to electromagnetic radiation propagating to the electronic component from an environment, may be embedded in the electronic device. For example, a magnetic element can be used as an electronic component. Such a magnetic element may be a permanent magnetic element (such as a ferromagnetic element, an antiferromagnetic element or a ferrimagnetic element, for instance a ferrite core) or may be a paramagnetic element.

In an embodiment, the at least one electrically insulating layer structure comprises at least one of the group consisting of resin, in particular Bismaleimide-Triazine resin, cyanate ester, glass, in particular glass fibers, prepreg material, polyimide, liquid crystal polymer, epoxy-based Build-Up Film, FR4 material, a ceramic, and a metal oxide. Although prepreg or FR4 are usually preferred, other materials may be used as well.

In an embodiment, the at least one electrically conductive layer structure comprises at least one of the group consisting of copper, aluminum, and nickel. Although copper is usually preferred, other materials are possible as well.

In an embodiment, the shielding cage forms an integral part of the component carrier. In other words, the shielding cage is no member being provided separately from the component carrier (such as a casing or lid) but in contrast to this may form part thereof. This results in a very compact configuration.

In an embodiment, at least a portion of the shielding cage provides a further electric function of the electronic device, in particular serves as conductor track for conducting electric signals between the electronic component and an external environment of the electronic device. Thus, sections of the shielding cage may be synergetically used to provide a shielding function and for at least one additional function such as the transmission of electric signals. This renders the electronic device small in size and light weight.

In an embodiment, at least a portion of the shielding cage is directly adhered to the electronic component by adhesive material. By gluing shielding cage and electronic component together, the shielding function can be provided very close to the electronic component and therefore very efficiently while at the same time keeping the electronic component small.

In an embodiment, the component carrier is a laminate-type component carrier. In such an embodiment, the component carrier is a compound of multiple layer structures which are stacked and connected together by applying a pressing force, if desired accompanied by heat.

In an embodiment, the shielding cage surrounds one side of the electronic component only partially and all remaining (in particular five) sides completely. This has the advantage that via the one only partially shielded side (for instance a bottom main surface), electrically decoupled or separated terminals may be established (via which signals may be guided in and/or out) while still maintaining a substantially fully shielded electronic device.

In an embodiment, the mounting base and the component carrier are made of the same material. This has a significantly positive impact on the stability and reliability of the electronic arrangement, since solder connections or other electric and mechanical interfaces between the electronic device and the mounting base are subjected to significantly less mechanical stress in the presence of thermal cycles as compared to a scenario in which the materials of the electronic device and the mounting base are very different from one another. This is due to the fact that different materials may have different values of the thermal expansion, causing mechanical stress. When electronic device and mounting base are however made substantially of the same material, thermally induced stress may be prevented and the lifetime of the electronic arrangement may be increased.

In an embodiment, the mounting base is a printed circuit board (PCB). The electronic device may also be a PCB with embedded electronic component and integrated shielding cage. Hence, the material of the mounting base and of the component carrier may be FR4/prepreg as electrically insulating material and copper as electrically conductive material. This involves only a small amount of materials, is thereby cost-efficient, and allows to implement well-known methods of PCB technology. Furthermore, issues with thermally induced load can be significantly reduced.

In an embodiment, the method further comprises adhering the electronic component vertically between electrically conductive foils forming at least part of the shielding cage and laterally to electrically insulating material of the component carrier (see FIG. 2). By adhering the electronic component to be embedded between two thin foils of copper or other suitable conductor material, the electronic component may be pre-positioned correctly on its top side and bottom side. Furthermore, by accommodating the electronic component in a through-hole or blind hole of an electrically insulating foil or the like, also its lateral position may be properly defined.

In an embodiment, the method further comprises forming terminal contacting blind holes through at least one of the electrically conductive foils and the adhesive material to thereby expose the electric terminals (see FIG. 3). By taking this measure, a simple and reliable external contacting of the electric terminals of the embedded electronic component is accomplished.

In an embodiment, the method further comprises forming side wall exposing oblong through holes through the electrically conductive foils and the electrically insulating material (see FIG. 3). Side wall exposing oblong through holes expose portions of the structure which portions later define sidewalls of the electronic device to be manufactured. The side wall exposing oblong through holes may have a rectangular, slit-like or slot-like form and may thus pre-define the geometry of the electronic device to be produced. Hole formation can be accomplished by laser drilling, mechanical drilling or by lithography and etching technology.

In an embodiment, the method further comprises applying electrically conductive material forming part of the shielding cage onto the terminal contacting blind holes and/or the side wall exposing oblong through holes (see FIG. 4). Hence, electrically conductive material may applied (for instance deposited) on the previously exposed later sidewalls of the electronic device. Singularizing may be performed by sawing, etching, laser cutting or cutting by drilling.

In an embodiment, the method further comprises singularizing the electronic device by removing material between the side wall exposing through holes (see FIG. 5). Singularizing may hence be performed by connecting adjacent oblong side wall exposing through holes to one another by removing webs or bridges between these through holes.

In an alternative embodiment, the packaging comprises forming a recess in electrically insulating material of the component carrier, applying electrically conductive material at least on a portion of the recess for forming at least part of the shielding cage, and placing, in particular adhering, the electronic component into the recess covered at least partially by the applied electrically conductive material (see FIG. 7 to FIG. 11). According to this procedure, a substantially cup-shaped metallic structure may be applied on the inner walls of the formed recess. Merely by coating horizontal and vertical walls of such a recess or trench with electrically conductive material, the shielding cage can be (in particular partially) formed very close to the electronic component to be embedded.

In an embodiment, the method further comprises filling up a remaining void of the recess filled partially with the electronic component by further electrically insulating material, subsequently forming terminal contacting blind holes extending through the further electrically insulating material to thereby expose the electric terminals, and applying further electrically conductive material forming part of the shielding cage onto the terminal contacting through holes (see FIG. 12 to FIG. 14). Preferably, the electronic component embedded in the recess and being already partially surrounded by shielding cage material may then be additionally coated on its top (partially or entirely) to complete the shielding cage.

The aspects defined above and further aspects of the invention are apparent from the examples of embodiment to be described hereinafter and are explained with reference to these examples of embodiment.

BRIEF DESCRIPTION OF THE DRAWINGS

FIG. 1, FIG. 2, FIG. 3 and FIG. 4 show cross-sectional views and FIG. 3 and FIG. 4 additionally show plan views of structures obtained during carrying out a method of manufacturing an electronic device according to an exemplary embodiment of the invention.

FIG. 5 shows a cross-sectional view of an electronic device according to an exemplary embodiment of the invention.

FIG. 6 shows a cross-sectional view of an electronic device according to another exemplary embodiment of the invention.

DETAILED DESCRIPTION OF EXEMPLARY EMBODIMENTS

Figure 1:
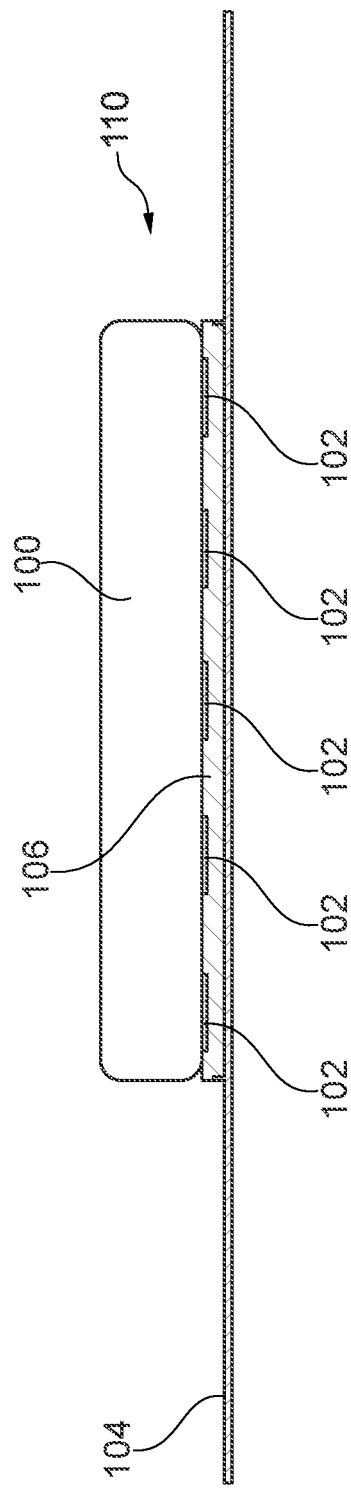

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to one exemplary embodiments (see for instance FIG. 1 to FIG. 5), a concept for component packaging with ECP (Embedded Component Packaging) is provided. One aspect of this embodiment is to provide a component packaging architecture. Packaging has traditionally utilized a molding process involving certain difficulties and restrictions. In contrast to this, according to an exemplary embodiment, embedding is utilized for component packaging purposes. Component packaging for active/passive components is normally done with various process methods using additional packaging material like resin or plastic. Using reinforced PCB materials according to an exemplary embodiment of the invention gives a benefit on the improved planarity of the package and providing a method to fully shield the package inside of the packaging material by using a standard copper foil and edge plating technology. Such a process can also be carried out more cost efficiently. This architecture allows to create a package with embedding technology, and hence with good planarity, high reliability and full shielding. Therefore, an alternative method to package wafers is provided which allows to use an embedding process for component packaging instead of epoxy or plastic moulding process. Such an embodiment provides a straight forward method for packaging, and as a reinforced material may be used, the flatness of the electronic device can be improved. A particular advantage is that the whole package can be copper shielded and thus any disturbances in and out are prohibited. Preferably, the packaging material can be the same as for a substrate PCB, thus removing differences in CTE (coefficient of thermal expansion) that often create issues during reflow processing of the components. An exemplary embodiment can be used for different packaging types to package wafer level components directly on the PCB material.

According to another exemplary embodiment of the invention (see for instance FIG. 7 to FIG. 14), a shielding against electromagnetic radiation may be accomplished directly at the position where electromagnetic radiation is generated, i.e. directly around an embedded electronic component. This can for instance be done by embedding the electronic component in a substantially cup-shaped recess in a base material coated with electrically conductive material. Thus, it is possible to suppress electromagnetic distortions not only between different electronic devices having different electronic components on and/or in it, but also between different electronic components embedded within one and the same electronic device. Therefore, an improved shielding of electromagnetic wave distortions can be achieved.

FIG. 1 to FIG. 4 show cross-sectional views and FIG. 3 and FIG. 4 show additionally plan views of structures obtained during carrying out a method of manufacturing an electronic device 500 according to an exemplary embodiment of the invention, the latter being shown in FIG. 5.

In terms of this method of manufacturing the electronic device 500 and as shown in FIG. 1, a naked die as electronic component 100, i.e. an unpackaged piece of processed semiconductor material with integrated circuits monolithically integrated therein, is provided with electric terminals 102 of electrically conductive material such as copper. Using a naked die as the electronic component 100 allows the manufacture of a highly compact electronic device 500. The electronic component 100 is an unpackaged semiconductor chip which can be directly obtained by singularizing a semiconductor wafer (for instance a silicon wafer) and is not yet packaged with a mold compound, etc. The integrated circuit may for instance comprise transistors, diodes, etc. By means of the electric terminals 102, electric signals may be supplied to and/or received from such integrated circuits. As an alternative to the use of a naked die as electronic component 100, it is also possible to use an entire wafer with terminals as electronic component 100.

The electronic component 100 is placed on an electrically conductive foil as electrically conductive layer structure 104, such as a copper foil, with electrically insulating adhesive material 106 in between. Thus, the adhesive material 106 is used to attach the electronic component 100 with its electric terminals 102 to the electrically conductive layer structure 104. Therefore, the electrically conductive layer structure 104, embodied as a copper foil, is assembled with the electronic component 100 (for instance a wafer level component or a chip level component). FIG. 1 therefore shows how the electronic component 100 with the electric terminals 102 is assembled with the electrically conductive layer structure 104. Therefore, component packaging can be performed by using sort of ECP (Embedded Component Packaging) technology.

Figure 2:
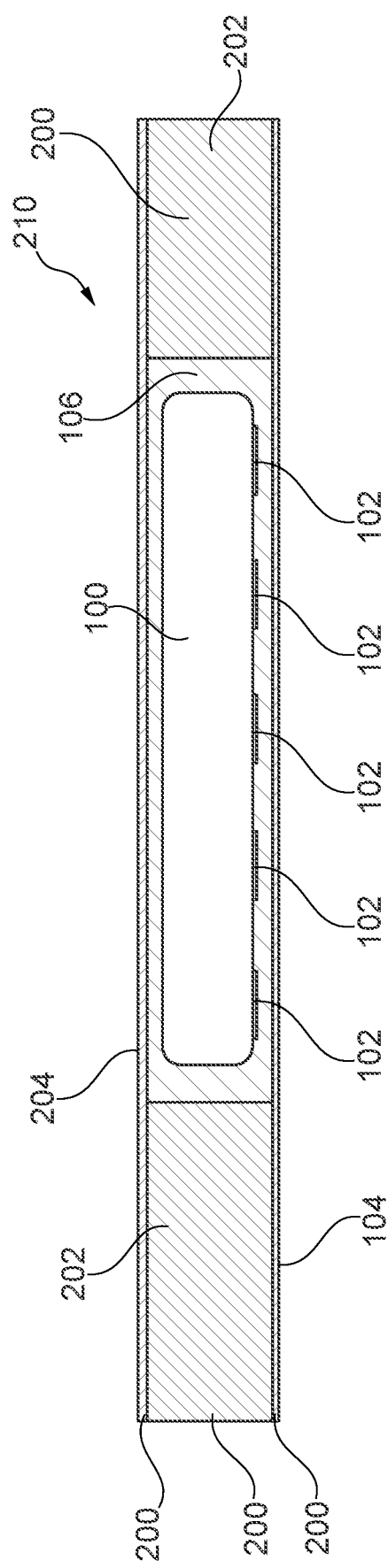

As can be taken from FIG. 2, the electronic component 100 is then packaged within plate-shaped component carrier 200, in the shown embodiment a printed circuit board (PCB). The adhesive material 106 as well as the electrically conductive layer structure 104 form part of this component carrier 200. For forming the component carrier 200, an electrically insulating layer structure 202—here embodied as a prepreg foil (forming a basis of an FR4 epoxy resin system) with cut-outs dimensioned for accommodating the electronic component 100 in a corresponding recess thereof—is attached onto structure 110 shown in FIG. 1. Subsequently, a further electrically conductive layer structure 204 (in particular a further electrically conductive foil, for instance made of copper) is put on top of the arrangement of structure 110 and electrically insulating structure 202. In other words, the further electrically conductive layer structure 204 (in form of the further copper foil) is pressed with the (wafer level component or chip level component in form of the) electronic component 102 and together with the electrically insulating layer structure 202 in form of the recessed prepreg layer to thereby form the component carrier 200. As can be taken from FIG. 2, the entire electronic component 100 is surrounded by the adhesive material 106.

As can be taken from FIG. 3, structure 210 according to FIG. 2 is then made subject of a drilling procedure. The method hence further comprises forming terminal contacting blind holes 300 through the electrically conductive layer structures 104, 204 and the adhesive material 106 to thereby expose the electric terminals 102. Moreover, the method further comprises forming side wall exposing oblong through holes 302 through the electrically conductive layer structures 104, 204 and the electrically insulating layer structure 202. Thus, microvia connections (see terminal contacting blind holes 300) are drilled and slots (see side wall exposing oblong through holes 302) are created around the component area (i.e. the region in which the electronic component 100 is located). The terminal contacting blind holes 300 can be formed by laser drilling to expose electrically conductive connections to the electronic component 102. The side wall exposing oblong through holes 302 are formed using routing or laser drilling around the electronic component 102. The shape of the dot-like terminal contacting blind holes 300 and of the oblong slit-like side wall exposing through holes 302 can be better seen in a plan view 320 of structure 310 of FIG. 3. In plan view 320, the side wall exposing through holes 302 circumferentially surround the terminal contacting blind holes 300 being arranged in a matrix like pattern.

In order to obtain structure 410 shown in FIG. 4 in a cross-sectional view and, compare reference numeral 420, in a plan view, structure 310 is made subject of a plating procedure, thereby covering all exposed surfaces of structure 310 with electrically conductive material such as copper. Thus, more generally, the method further comprises applying electrically conductive material onto the terminal contacting blind holes 300 and the side wall exposing oblong through holes 302. In particular, as indicated by reference numeral 430, the outline of the module is edge plated. As indicated by reference numeral 440, the side wall exposing oblong through holes 300 are filled with the plating material so that the connections to the electronic component 100 and in particular its electric terminals 102 are plated. By this plating procedure in combination with the previous provision of two electrically conductive layer structures 104, 204, all six sides or side surfaces of the component carrier 200 with the electronic component 100 embedded therein is fully covered with electrically conductive material constituting a shielding cage 400 polydirectionally surrounding the electronic component 100. The electronic component 100 is thereby sandwiched vertically between the two foil-type electrically conductive layer structures 104, 204 forming part of the shielding cage 400 on two opposing main surfaces 102. Furthermore, the electronic component 100 is laterally adjacent to electrically insulating material of the component carrier 200. However, the exterior lateral walls of the electrically insulating layer structure 202 of the component carrier 200 is also covered by electrically conductive plating material. The shielding cage 400 is thus also partially formed by an electrically conductive covering or coating of lateral side walls 404 of the plate.

In order to obtain the electronic device 500 shown in FIG. 5, the central portion of structure 410 delimited by the side wall exposing through holes 302 is then singularized to isolate or separate the electronic device 500 from the rest of the structure 410 by removing material between adjacent pairs of the side wall exposing through holes 302. This removal of material can be performed by laser drilling, routing, etching, etc.

FIG. 5 shows a cross-sectional view of electronic device 500 according to an exemplary embodiment of the invention, as obtained from the manufacturing method described referring to FIG. 1 to FIG. 4. As can be taken from FIG. 5, the manufacturing process is finalized after the singularization by which the shown electronic device 500 is obtained.

The electronic device 500 is a highly compact and nevertheless properly radio frequency protected package of the electronic component 100 in form of the naked die with its electric terminals 102 packaged within PCB type component carrier 200. Highly advantageously, the component carrier 200 itself comprises a fully surrounding (i.e. surrounding from all six sides, i.e. from the front side and from the back side, from the top side and from the bottom side, from the left side and from the right side) shielding cage 400 shielding the electronic component 100 with regard to electromagnetic radiation (in particular in the radio frequency range) from an exterior of the shielding cage 400. At the same time, electromagnetic radiation which might be generated by electronic component 100 during operation of the electronic device 500 can be prevented from propagating out of the shielding cage 400. The electronic component 100 can therefore be prevented from suffering or causing deterioration of performance due to an interaction with any other electronic components in an environment (or, in another embodiment, within the same electronic device 500). Hence, an efficient protection against electromagnetic interference (EMI) can be obtained.

As can be taken from FIG. 5 and indicated by reference numeral 510, the copper foils (see reference numerals 104, 204) on both opposing main surfaces 402 efficiently shield the package from upside and downside. As can be taken from FIG. 5 as well and indicated by reference numeral 520, a lateral side protection is provided by edge plating completing the shielding cage 400.

Starting from the electronic device 500, further processing of the latter is possible. In particular, the copper layer covering the lower main surface (see electrically conductive layer structure 104) may be patterned so as to define separate electric pads or terminals 102. As a consequence of this further processing, the shielding may remain only partially on the lower main surface. However, in order to recover a substantially hermetically closed shielding cage 400, it is possible to laminate one or more further layer structures onto the lower main surface according to FIG. 5, wherein at least one thereof may be a continuous electrically conductive layer (not shown) which then forms part of the shielding structure 400 as well.

FIG. 6 shows a cross-sectional view of an electronic device 500 according to another exemplary embodiment of the invention in which two electronic components 100 are embedded within the same component carrier 200. The shielding cage 400 is composed, according to FIG. 6, as two surrounding electrically conductive shells each of which enclosing a respective one of the electronic components 100 individually. This suppresses undesired propagation of electromagnetic radiation (in particular in the radio frequency range) between an interior and an exterior of the electronic device 500. Since the shielding cage 400 according to FIG. 6 also surrounds each of the electronic components 100 individually (see separation wall 600 of electrically conductive material, electromagnetically separating the two electronic components 100 from one another), additionally intra-package electronic interference is advantageously prevented or suppressed according to FIG. 6. In other words, even electromagnetic radiation generated by one of the electronic components 100 is prevented from distorting the respectively other one of the electronic components 100. The electronic device 500 according to FIG. 6 can be manufactured in a similar way as the electronic component 500 shown in FIG. 5, wherein two electronic components 500 according to FIG. 5 can be laterally connected to one another (for instance by glue) to obtain the electronic device 500 according to FIG. 6.

FIG. 7 to FIG. 13 show cross-sectional views of structures obtained during carrying out a method of manufacturing an electronic device 500 according to another exemplary embodiment of the invention.

Figure 7:
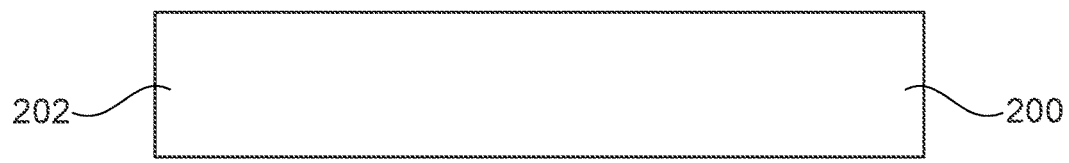
FIG. 7, FIG. 8, FIG. 9, FIG. 10, FIG. 11, FIG. 12 and FIG. 13 show cross-sectional views of structures obtained during carrying out a method of manufacturing an electronic device according to another exemplary embodiment of the invention.

FIG. 7 shows an electrically insulating epoxy resin structure (cured, in C-stage) as electrically insulating material 202 forming part of a component carrier 200 and being used as a starting material for the following manufacturing process.

Figure 8:

In order to obtain a structure 810 shown in FIG. 8, a recess 800 (i.e. an indentation or a cavity) is formed in the electrically insulating material 202. A depth and a width of the recess 800 are selected so as to be appropriate for accommodating an electronic component 100 therein. The recess 800 can be formed by milling or laser treatment.

Figure 9:
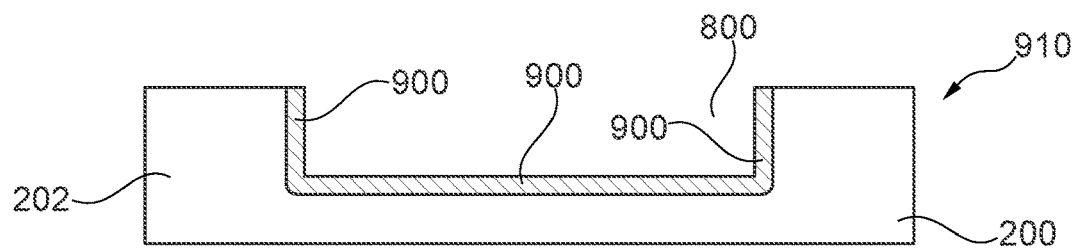

In order to obtain a structure 910 shown in FIG. 9, structure 810 shown in FIG. 8 is made subject to a metal deposition procedure so that a copper layer is formed in the recess 800 as electrically conductive layer structure 900. The electrically conductive layer structure 900 can be formed chemically, galvanically, by an additive procedure, by sputtering, etc. Thus, electrically conductive material is applied for forming part of the shielding cage 400 (see FIG. 14), onto at least part of an exposed surface of the recess 800.

Figure 10:
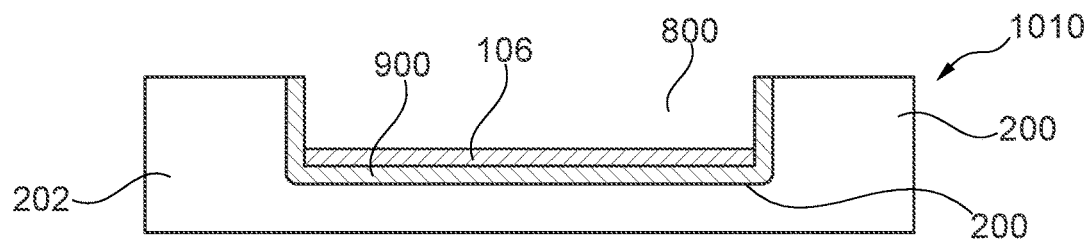

In order to obtain structure 1010 shown in FIG. 10, an adhesive depot is applied in the form of adhesive material 106 in the recess 800 covering the bottom thereof. The adhesive material 106 can be epoxy-based adhesive which can be cured thermally, can be applied by screen printing, stencil printing or dispensing.

Figure 11:
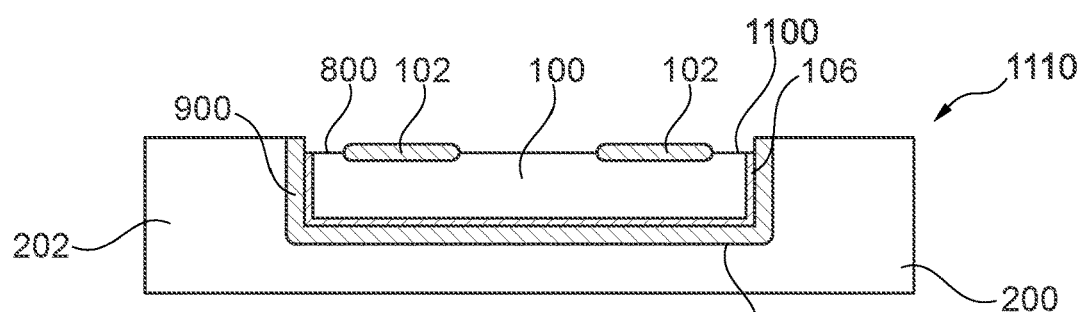

In order to obtain structure 1110 shown in FIG. 11, an electronic component 100 (for instance a naked die or a die packaged in a molding compound) with terminals 102 is accommodated in the recess 800 with the electrically conductive layer structure 900 and the adhesive material 106 therein. The electric terminals 102 are located at an upper side of the structure 1110 and thereby remain exposed to an environment. Subsequently, the adhesive material 106 may be cured, for example by applying thermal energy. Thus, the electronic device 100 is placed and adhered into the recess 800 so as to be covered partially by the applied electrically conductive material in form of the electrically conductive layer structure 900. A void 1110 may remain at a surface of the structure 1110.

Figure 12:
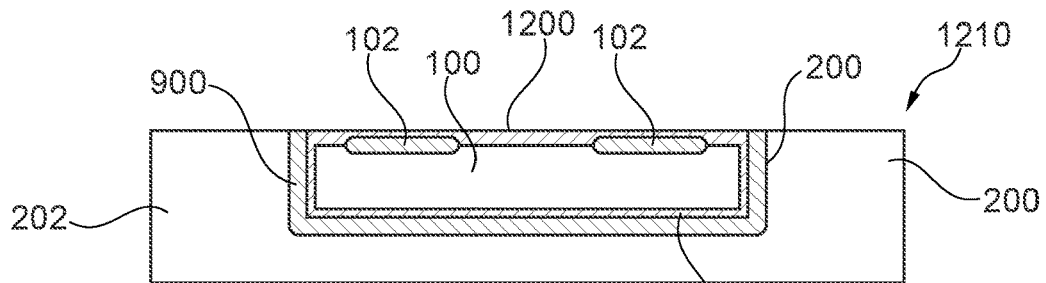

In order to obtain structure 1210 shown in FIG. 12, the remaining void 1100 of the (up to now only partially filled) recess 800 above the electronic component 100 is filled with electrically insulating material 1200, such as epoxy resin.

Figure 13:
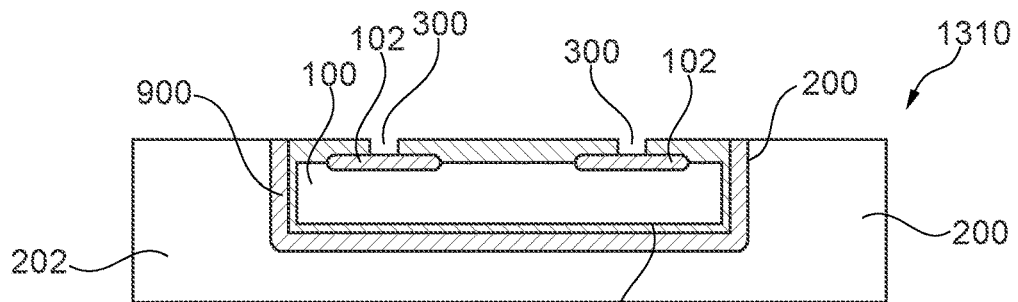

In order to obtain structure 1310 shown in FIG. 13, the electric terminals 102 of the electronic component 100 are exposed by patterning the further electrically insulating material 1200, for instance using a $CO_2$ laser with defined beam diameter. Thereby, terminal contacting blind holes 300 are formed. Hence, the terminal contacting blind holes 300 are subsequently formed to extend through the further electrically insulating material 1200 to thereby expose the electric terminals 102.

Figure 14:
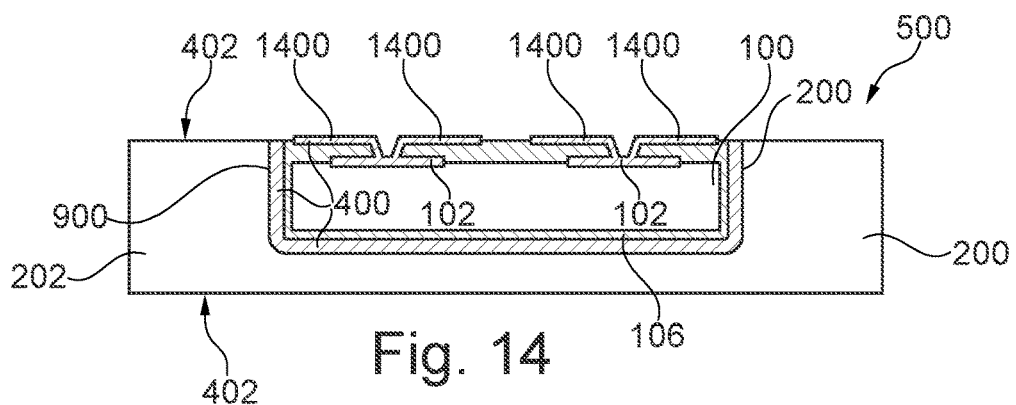
FIG. 14 shows a cross-sectional view of an electronic device according to another exemplary embodiment of the invention.

FIG. 14 shows a cross-sectional view of an electronic device 500 according to another exemplary embodiment of the invention.

Based on structure 1310, the electronic device 500 according to FIG. 14 is obtained by applying further electrically conductive material 1400, also forming part of the shielding cage 400, onto the terminal contacting through holes 300 and onto laterally adjacent sections. Thereby, external electric contacts to the electronic component 100 are formed. However, as can be taken from FIG. 14, the applied further electrically conductive material 1400 laterally extends beyond the lateral extension of the electric terminals 102 to cover also a majority of the upper main surface 402 of the electronic device 500. By this laterally extending configuration of the applied further electrically conductive material 1400, the performance of the shielding cage 400 in terms of suppressing electromagnetic interference (EMI) can be further improved. Thus, the electronic device 500 shown in FIG. 14 is finally obtained by depositing copper in the blind holes formed according to FIG. 13, and on the exterior surface of the electronic terminals 102. This can be done chemically, galvanically, by an additive procedure, or by sputtering.

According to FIG. 14 the shielding cage 400 is partially formed in an interior portion of, and partially formed in an exterior of the component carrier 200 and comprises electrically conductive material in the interior of the component carrier 200 extending vertically and hence along a direction which is perpendicular to the main surface 402 of the component carrier 200. Part of the shielding cage 400 is arranged at an interface between the electronic component 100 and the component carrier 200. The embodiment according to FIG. 14 has the advantage that the shielding cage 400 is located very close to the electronic component 100, thereby efficiently shielding electromagnetic radiation with a compact design and a very small amount of the electrically conductive material needed for forming the shielding cage 400. In contrast to the embodiment of FIG. 5, the shielding cage 400 of the embodiment of FIG. 14 does not substantially hermetically seal an interior of the shielding cage 400 with regard to an environment, but only partially shields a top surface. More specifically, the shielding cage 400 according to FIG. 14 comprises a substantially cup-shaped portion (fully covering five sides of the electronic component 100, see reference numeral 900), wherein an open upper side of this cup-shaped portion is partially covered or provides a partial shielding with electrically conductive material as well (see reference numerals 102, 1400).

Figure 15:
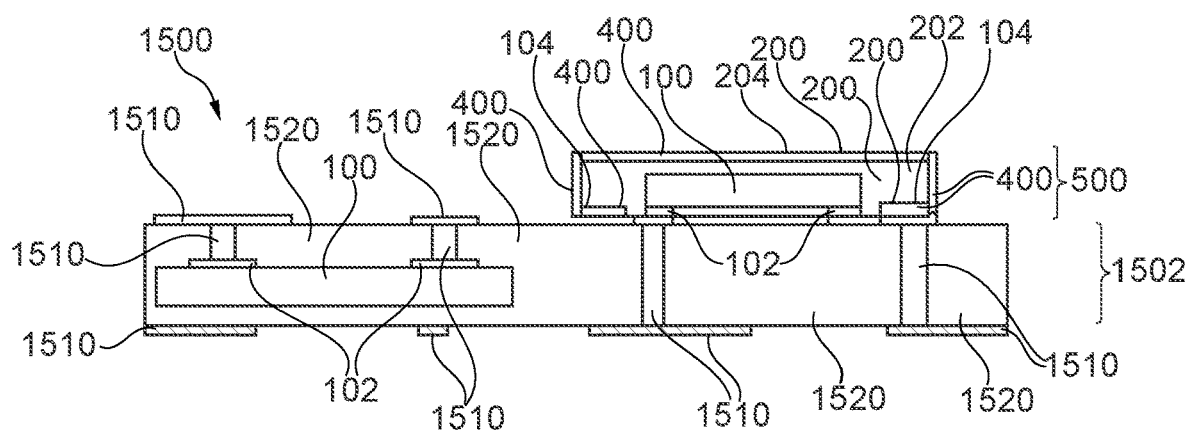
FIG. 15 shows a cross-sectional view of an electronic arrangement according to an exemplary embodiment of the invention.

FIG. 15 shows a cross-sectional view of an electronic arrangement 1500 according to an exemplary embodiment of the invention.

The electronic arrangement 1500 comprises an electronic device 500 having the above-mentioned features (in particularly being configured similar to FIG. 5) and a mounting base 1502 on which the electronic device 500 is surface mounted. In FIG. 15, the mounting base 1502 functions as a carrier and the electronic device 500 functions as a package or module being surface mounted on the carrier.

Advantageously, the mounting base 1502 and the component carrier 200 are made of the same material, i.e. based on a resin (optionally with embedded glass fibers therein) as electrically insulating material and copper as electrically conductive material (see reference numeral 1510 for electrically conductive structures and reference numeral 1520 for electrically insulating structures of the mounting base 1502). Both the mounting base 1502 and the component carrier 200 are printed circuit board type members.

In the shown embodiment, the mounting base 1502 has embedded therein an electronic component 100. Due to the fact that the shielding cage 400 of the electronic device 500 shields the electronic component 100 embedded in the electronic device 500 with regard to electromagnetic radiation generated by the electronic component 100 embedded in the mounting base 1502, and vice versa, both electronic components 100 are protected against undesired electromagnetic interference.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A method of manufacturing an electronic device, the method comprising:
   providing an electronic component with electric terminals;
   adhering the electronic component vertically between electrically conductive foils forming at least part of a shielding cage and laterally to electrically-insulating material of a component carrier, thereby
   packaging the electronic component within the component carrier;
   forming side wall exposing oblong through holes through the electrically conductive foils and the electrically insulating material, the sidewall exposing oblong through holes having a rectangular form;
   applying electrically conductive material forming part of the shielding cage onto the side wall exposing oblong through holes, whereby
   the component carrier is equipped with the shielding cage surrounding all sides of the electronic component at least partially.

2. The method according to claim 1, wherein the method further comprises:
   forming terminal contacting blind holes through at least one of the electrically conductive foils and an adhesive material to thereby expose at least part of the electric terminals.

3. The method according to claim 2, wherein the method further comprises:
   applying electrically conductive material forming part of the shielding cage onto the terminal contacting blind holes.

4. The method according to claim 1, wherein the method further comprises:
   singularizing the electronic device by removing material between the side wall exposing oblong through holes.

* * * * *